United States Patent
Kang et al.

(10) Patent No.: US 7,738,288 B2
(45) Date of Patent: Jun. 15, 2010

(54) PHASE CHANGE MEMORY DEVICE HAVING A PLURALITY OF REFERENCE CURRENTS AND OPERATING METHOD THEREOF

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 212 days.

(21) Appl. No.: 12/133,809

(22) Filed: Jun. 5, 2008

(65) Prior Publication Data
US 2009/0067227 A1 Mar. 12, 2009

(30) Foreign Application Priority Data
Sep. 6, 2007 (KR) .................. 10-2007-0090388

(51) Int. Cl.
*G11C 11/00* (2006.01)
(52) U.S. Cl. .................. 365/158; 365/171; 365/173
(58) Field of Classification Search .............. 365/158, 365/171, 173
See application file for complete search history.

(56) References Cited

U.S. PATENT DOCUMENTS

| 7,359,231 | B2 * | 4/2008 | Venkataraman et al. ..... 365/148 |
| 2005/0068804 | A1 | 3/2005 | Choi et al. |
| 2006/0109704 | A1 | 5/2006 | Seo et al. |
| 2006/0221712 | A1 | 10/2006 | Lowrey et al. |

FOREIGN PATENT DOCUMENTS

KR 2005-0102952 A 10/2005

\* cited by examiner

*Primary Examiner*—Son Dinh
*Assistant Examiner*—Nam Nguyen
(74) *Attorney, Agent, or Firm*—Ladas & Parry LLP

(57) ABSTRACT

A phase change memory device includes a cell array unit including a phase change resistance cell positioned at an intersection of a word line and a bit line. A plurality of sense amplifiers sense and amplify data of the phase change resistance cell selected using a plurality of reference currents. A plurality of comparing units compare an output signal of the corresponding sense amplifier with that of the neighboring sense amplifier so as to output a flag enable signal.

21 Claims, 15 Drawing Sheets

PHASE CHANGE MEMORY DEVICE HAVING A PLURALITY OF REFERENCE CURRENTS AND OPERATING METHOD THEREOF

CROSS-REFERENCE TO RELATED APPLICATION

The present application is based upon and claims priority to Korean Patent Application No. 10-2007-0090388 filed on Sep. 6, 2007, which is incorporated herein by reference in its entirety.

BACKGROUND OF THE INVENTION

The present invention relate generally to a phase change memory device and an operating method thereof, and more particularly to a phase change memory device and an operating method thereof for outputting effective cell data by applying a reference current suitable for the characteristics of each cell of the memory.

A nonvolatile memory has a data processing speed similar to that of a volatile Random Access Memory (RAM), however, unlike a volatile RAM, a nonvolatile memory conserves a data even when no power is supplied to the memory, i.e., when the power is turned off. Examples of a nonvolatile memory include a magnetic memory and a phase change memory (PCM).

FIGS. 1a and 1b are diagrams showing a conventional phase change resistor (PCR) 4.

The PCR 4 comprises a phase change material (PCM) 2 inserted between an upper electrode 1 and a lower electrode 3. When a voltage and a current are applied to the conventional PCR 4, a high temperature is generated in the PCM 2 such that an electric conductive state of the PCR 4 changes depending on the resistance of the PCM 2.

The PCM 2 may comprise AgLnSbTe. The PCM 2 may also comprise chalcogenide having chalcogen elements (S, Se, Te) as a main ingredient, and specifically includes a germanium antimonic tellurium (Ge2Sb2Te5) consisting of Ge—Sb—Te.

FIGS. 2a and 2b are diagrams showing the principle operation of the conventional PCR 4.

As shown in FIG. 2a, the PCM 2 can be crystallized when a low current, i.e., a current less than a threshold value, flows into the PCR 4. As a result, the PCM 2 is crystallized and acts as a low resistance material.

As shown in FIG. 2b, the PCM 2 can be amorphized when a high current, i.e., a current higher than a threshold value, flows into the PCR 4. That is, the temperature of the PCM 2 is increased higher than the melting point of the PCM 2 when a high current flows into the PCR 4. As a result, the PCM 2 becomes amorphous and acts as a high resistance material.

In this way, the PCR 4 is configured to store a nonvolatile data corresponding to the two resistance states. Data "1" refers to a low resistance state of the PCR 4, and data "0" refers to a high resistance state of the PCR 4, and as such the data can be stored to have one of the two logic states.

FIG. 3 is a diagram showing a write operation of a conventional phase change resistant cell.

Heat is generated when a current flows through the upper electrode 1 and the lower electrode 3 of the PCR 4 for a given time. As a result, a state of the PCM 2 is changed to be either crystalline or amorphous depending on the temperature generated according to the current applied to the upper electrode 1 and the lower electrode 3.

A low temperature heating state occurs when a low current flows for a given time. As a result, the PCM 2 becomes crystalline and the PCR 4, which acts as a low resistor, is at a set state. On the other hand, a high temperature heating state occurs when a high current flows for a given time. As a result, the PCM 2 becomes amorphous and the PCR 4, which acts as a high resistor, is at a reset state. A difference between two phases is represented by a change in electric resistance.

As shown in FIG. 3, a low voltage is applied to the PCR 4 for a period of time in order to write the set state in a write mode. On the other hand, a high voltage is applied to the PCR 4 for a shorter period of time in order to write the reset state in the write mode.

FIG. 4 is a diagram showing a read current relationship of a conventional phase change memory device.

Each cell included in a plurality of cell arrays has a different read current distribution depending on process, element, and design conditions. That is, the distribution of a set current Iset and a reset current Ireset becomes broader based on a single reference current Iref.

If a characteristic group of each cell is divided into three regions A, B, C, the distribution of the set current Iset and the reset current Ireset is located at a different region. As a result, read currents are overlapped in some cells based on the single reference current Iref.

A fail condition may occur in some cells when the reset current Ireset is incorrectly distinguished from the set current Iset by the reference current Iref due to the overlap discussed above.

SUMMARY OF THE INVENTION

The present invention includes a phase change memory effectively outputting a data with a reference current corresponding to the characteristics of each phase change resistance cell included in a cell array in a read mode.

According to an embodiment of the present invention, a phase change memory device comprises: a cell array unit including a phase change resistance cell positioned at an intersection of a word line and a bit line; a plurality of sense amplifiers configured to sense and amplify a data of the phase change resistance cell selected using a plurality of reference currents; and a plurality of comparing units configured to compare an output signal of the corresponding sense amplifier with that of the neighboring sense amplifier so as to output a flag enable signal.

According to an embodiment of the present invention, an operating method of a phase change memory device, which comprises a plurality of sense amplifiers configured to compare a data of a phase change resistance cell with a plurality of reference currents; a plurality of flags configured to store output signals of the sense amplifiers; and a plurality of comparing units configured to compare an output signal of the corresponding sense amplifier with that of the neighboring sense amplifier to control a plurality of flags, comprises: reading a data of the phase change resistance cell using the reference currents in a read mode; storing read results in the phase change resistance cell in the flags; writing a first data in the phase change resistance cell; reading a data of the phase change resistance cell using the reference currents; comparing the different reference currents with the data read in the phase change resistance cell; and outputting a data stored in the corresponding flag when the different reference current is different from the read data.

DETAILED DESCRIPTION OF EMBODIMENTS

Figure 1A:
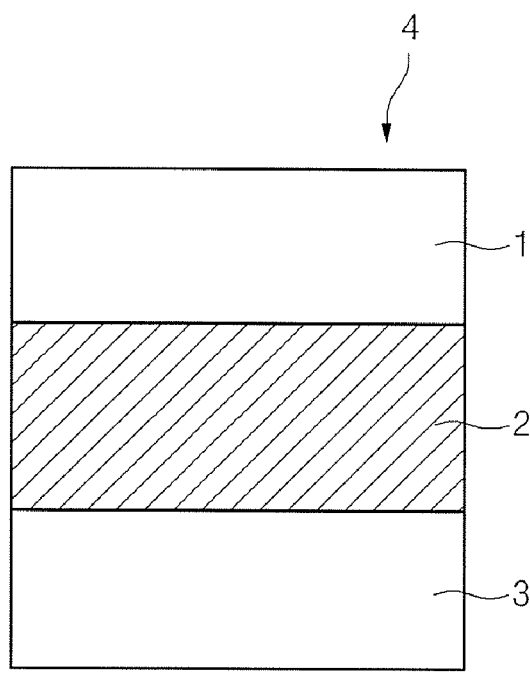
FIGS. 1a and 1b are diagrams showing a conventional phase change resistor.
Figure 1B:
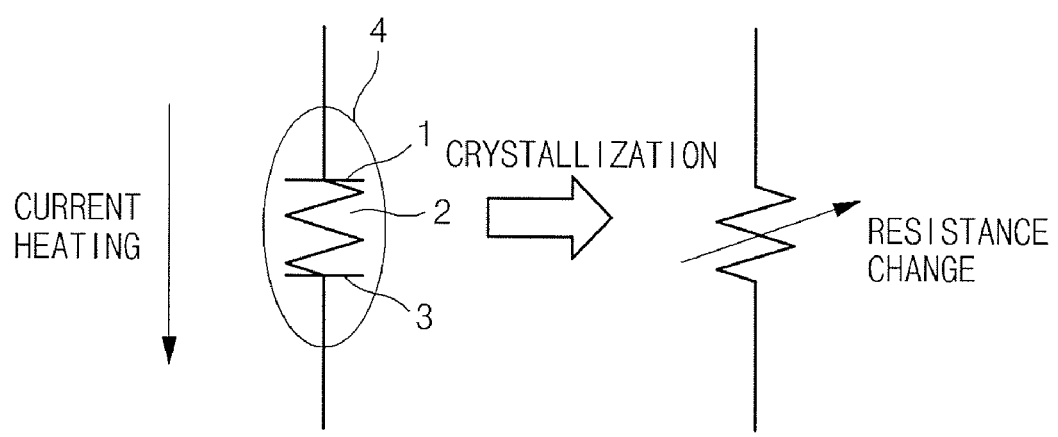
Figure 2A:
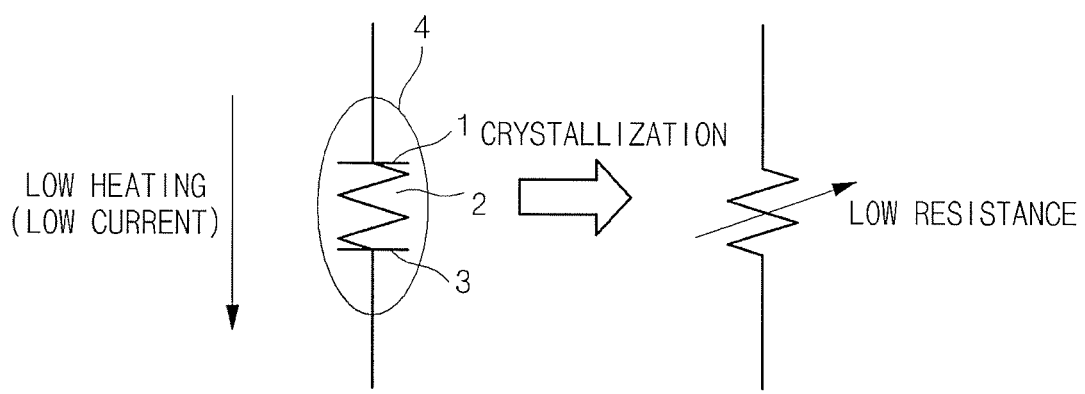
FIGS. 2a and 2b are diagrams showing the principle operation of the conventional phase change resistor.
Figure 2B:
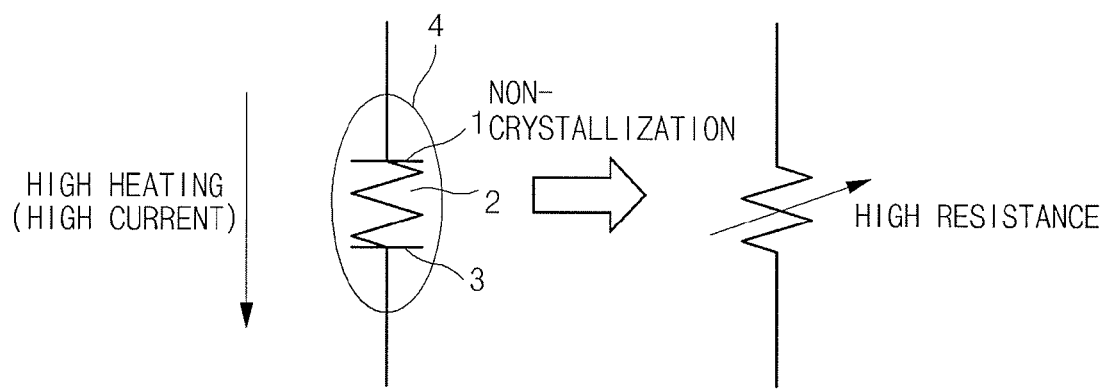
Figure 3:
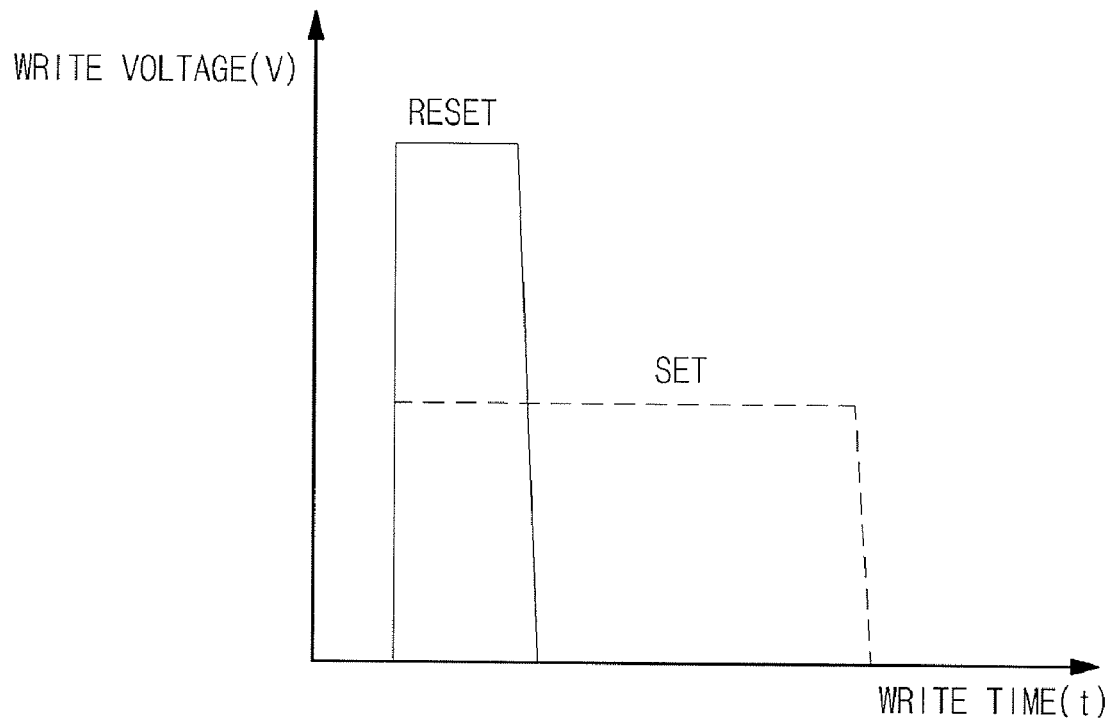
FIG. 3 is a diagram showing a write operation of a conventional phase change resistant cell.
Figure 4:
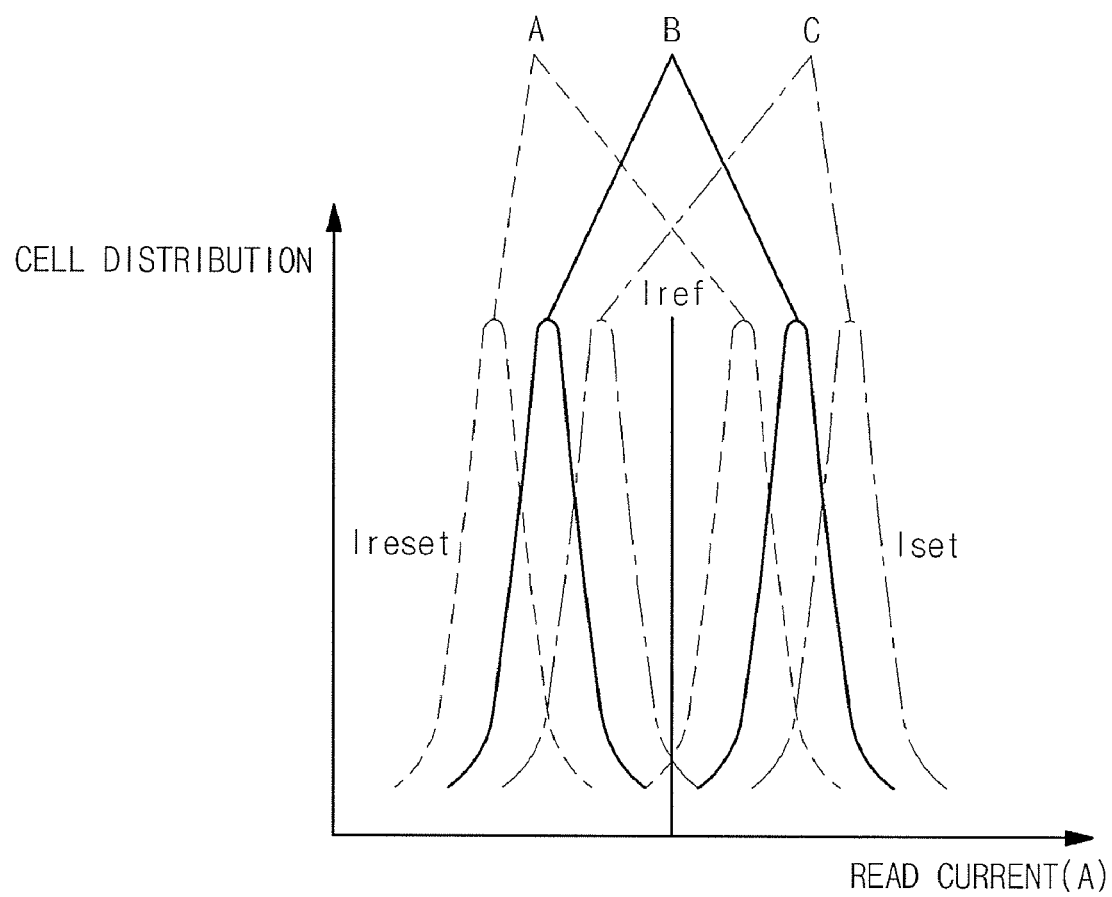
FIG. 4 is a diagram showing a read current relationship of a conventional phase change memory device.
Figure 5:
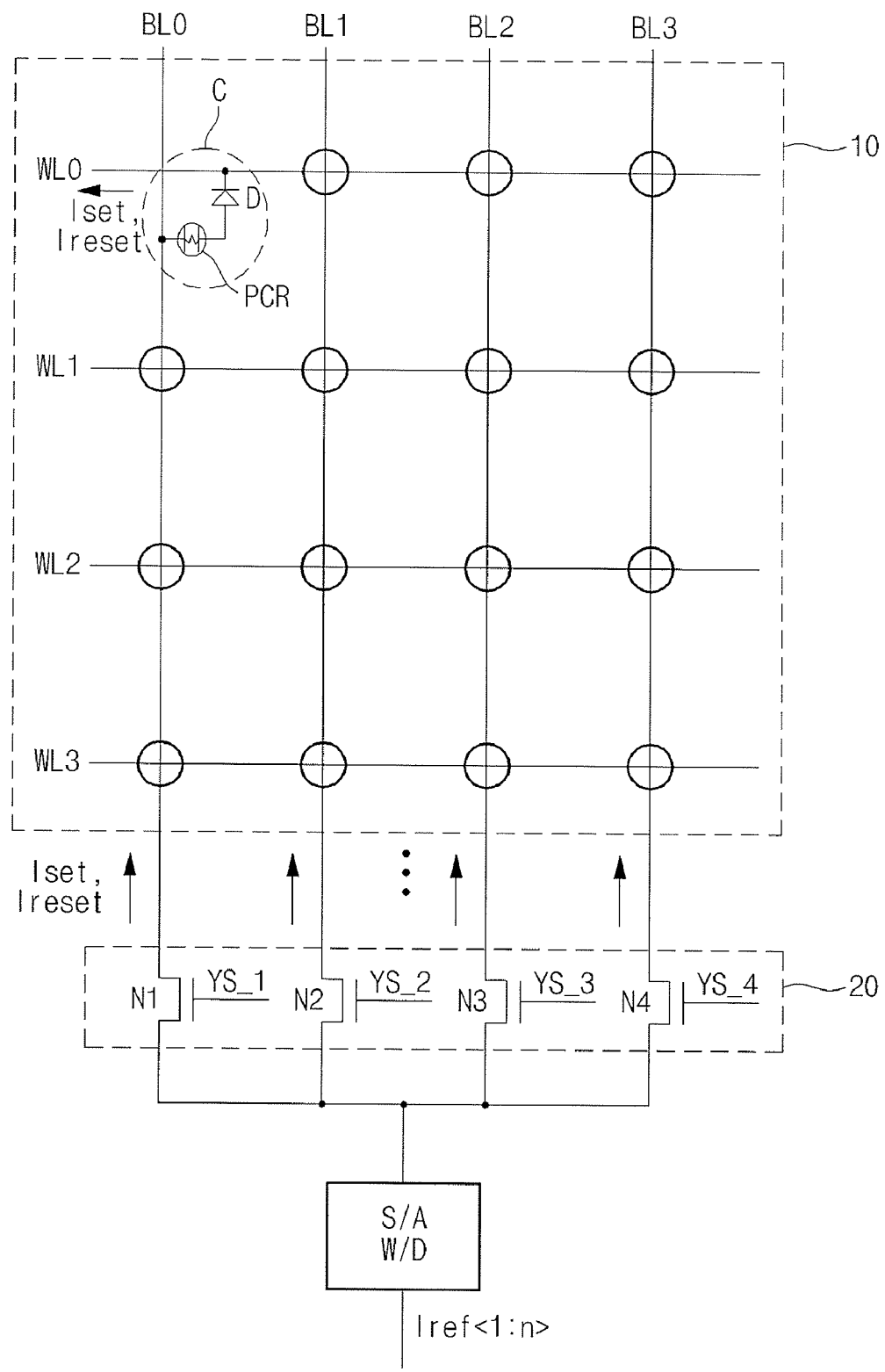
FIG. 5 is a circuit diagram showing a phase change memory device according to an embodiment of the present invention.

FIG. 5 is a circuit diagram showing a phase change memory device according to an embodiment of the present invention.

The phase change memory device of FIG. 5 includes a cell array 10, a column selecting unit 20, a sense amplifier S/A, and a write driving unit W/D.

The cell array 10 includes a plurality of bit lines BL0~BL3 arranged in a column direction and a plurality of word lines WL0~WL3 arranged in a row direction. The cell array 10 includes a plurality of unit cells, or phase change resistance cells, C arranged at intersections of the bit lines BL0~BL3 and the word lines WL0~WL3. The unit cell C includes a phase change resistor PCR and a PN diode D.

The phase change resistor PCR has one terminal connected to a bit line (for example BL0) and the other terminal connected to a P-type region of the PN diode D. The PN diode D has a P-type region connected to one terminal of the phase change resistor PCR as described above and an N-type region connected to a word line WL (for example WL0).

The phase of the phase change resistor PCR in the phase change resistance cell C is changed according to a set current Iset and a reset current Ireset flowing in the bit line BL0 to write a data.

The column selecting unit 20 includes a plurality of column selecting switching elements N1~N4. The column selecting switching elements connected between the bit lines BL0~BL3 and the sense amplifier S/A and the write driving unit W/D. The gates of the switching elements N1~N4 are connected to a plurality of column selecting signals YS_1~YS_4 respectively. The column selecting switching elements include NMOS transistors N1~N4.

The sense amplifier S/A senses a cell data received through the bit lines BL0~BL3, and compares the cell data with a plurality of reference currents Iref<1:$n$> to distinguish between a set data and a reset data. The value of each of the reference currents Iref<1:$n$> progressively increases, such that the reference current Iref1 has the smallest current value and Irefn has the largest current value.

In the phase change resistance cell C, a set current Iset or a reset current Ireset is distributed between the reference current Iref1 and the reference current Irefn. For example, based on the reference current Iref1, a data of the phase change resistance cell C having a read current value smaller than that of the reference current Iref1 is outputted as a reset data (data "0"). Alternatively, the phase change resistance cell C having a read current value larger than that of the reference current Iref1 is outputted at a set data (data "1").

For example in the phase change resistance cell C having the written set data, when the data "0" is changed into the data "1", the reference current Iref having the data "1" becomes effective. Similarly, in the phase change resistance cell C having the written reset data, when the data "1" is changed into the data "0", the reference current Iref having the data "0" becomes effective.

The write driving unit W/D supplies a write voltage corresponding to the data state to the bit line BL0 when a data is written in the phase change resistance cell C.

Figure 6:
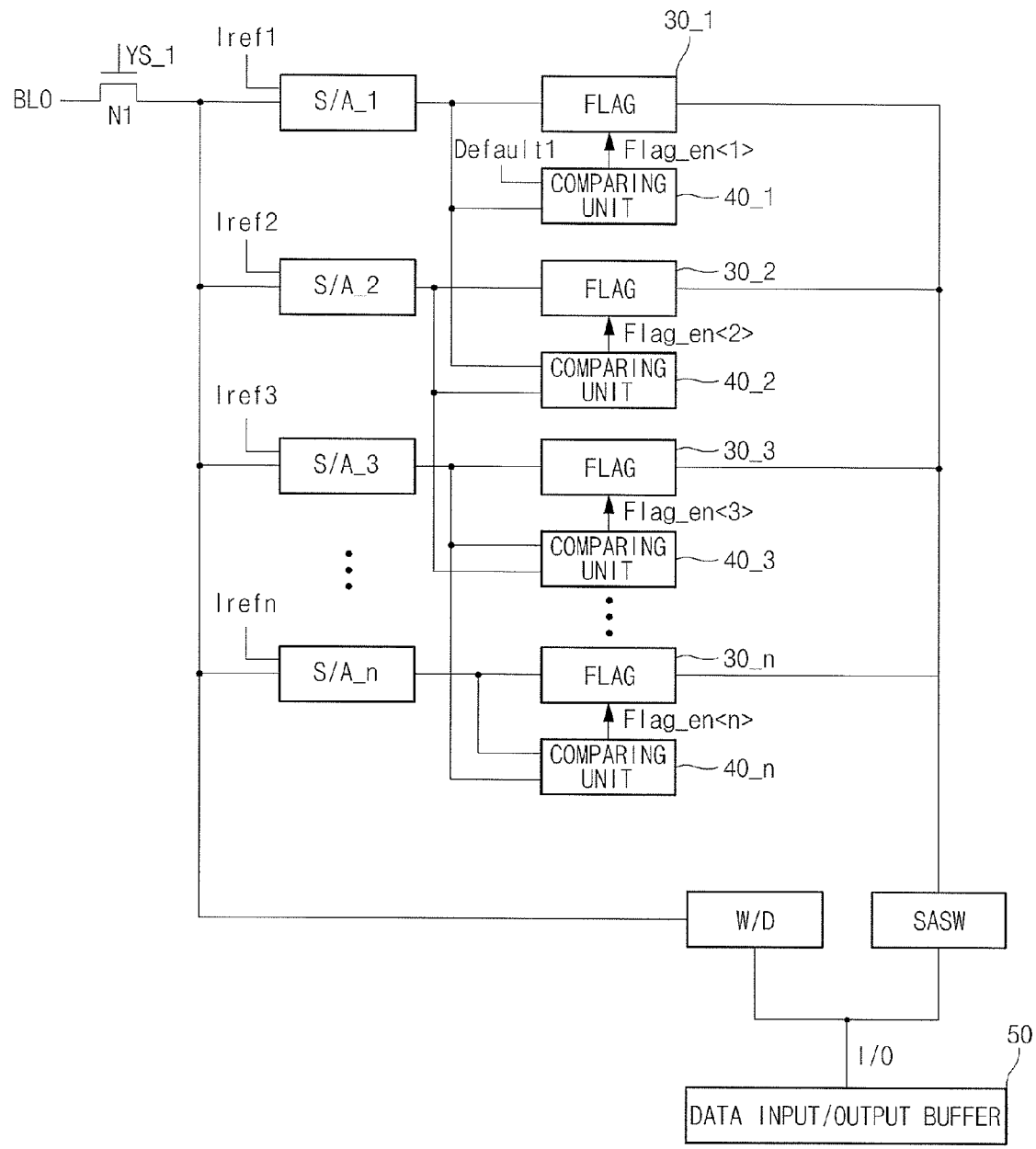
FIG. 6 is a circuit diagram showing a sense amplifier and a write driving unit according to the first embodiment of the present invention.

FIG. 6 is a circuit diagram showing a sense amplifier S/A and a write driving unit W/D according to the first embodiment of the present invention.

A phase change memory device as shown in FIG. 6 includes a plurality of sense amplifiers S/A_1~S/A_n, a plurality of flags 30_1~30_n, a plurality of comparing units 40_1~40_$n$, a write driving unit W/D, a sense amplifier switching unit SASW, and a data input/output buffer 50.

The sense amplifiers S/A_1~S/A_n compare the reference currents Iref1_Irefn with the set current Iset or the reset current Ireset received through the column selecting switching element N1 to output the set data or the reset data.

The flags 30_1~30_$n$ store output signals of the sense amplifiers S/A_1~S/A_n in response to a plurality of flag enable signals Flag_en<1:$n$>.

Each comparing units 40_1~40_$n$ compares the output signal of the corresponding sense amplifiers S/A_1~S/A_n with the output signal of the preceding neighboring sense amplifier S/A_1~S/A_n, respectively, to output the flag enable signals Flag_en<1:$n$>. For example, comparing unit 40_2 compares the output signals of corresponding sense amplifier S/A_2 and preceding neighboring sense amplifier S/A_1 to output flag enable signal Flag_en2. Preferably, the first comparing unit 40_1 compares an output signal of the corresponding sense amplifier S/A_1 to an initial value Default 1. The initial value Default 1 is the data "0".

The write driving unit W/D receives the reset data or the set data from the data input/output buffer 50 and applies a write voltage corresponding to each data state to the corresponding bit line BL1~BL4.

The sense amplifier switching unit SASW selectively outputs output signals of the flags 30_1~30_$n$ to the data input/output buffer 50. The data input/output buffer 50 receives a data externally and outputs the data to an input/output line I/O, or alternatively outputs the data of the input/output line I/O externally.

Figure 7:
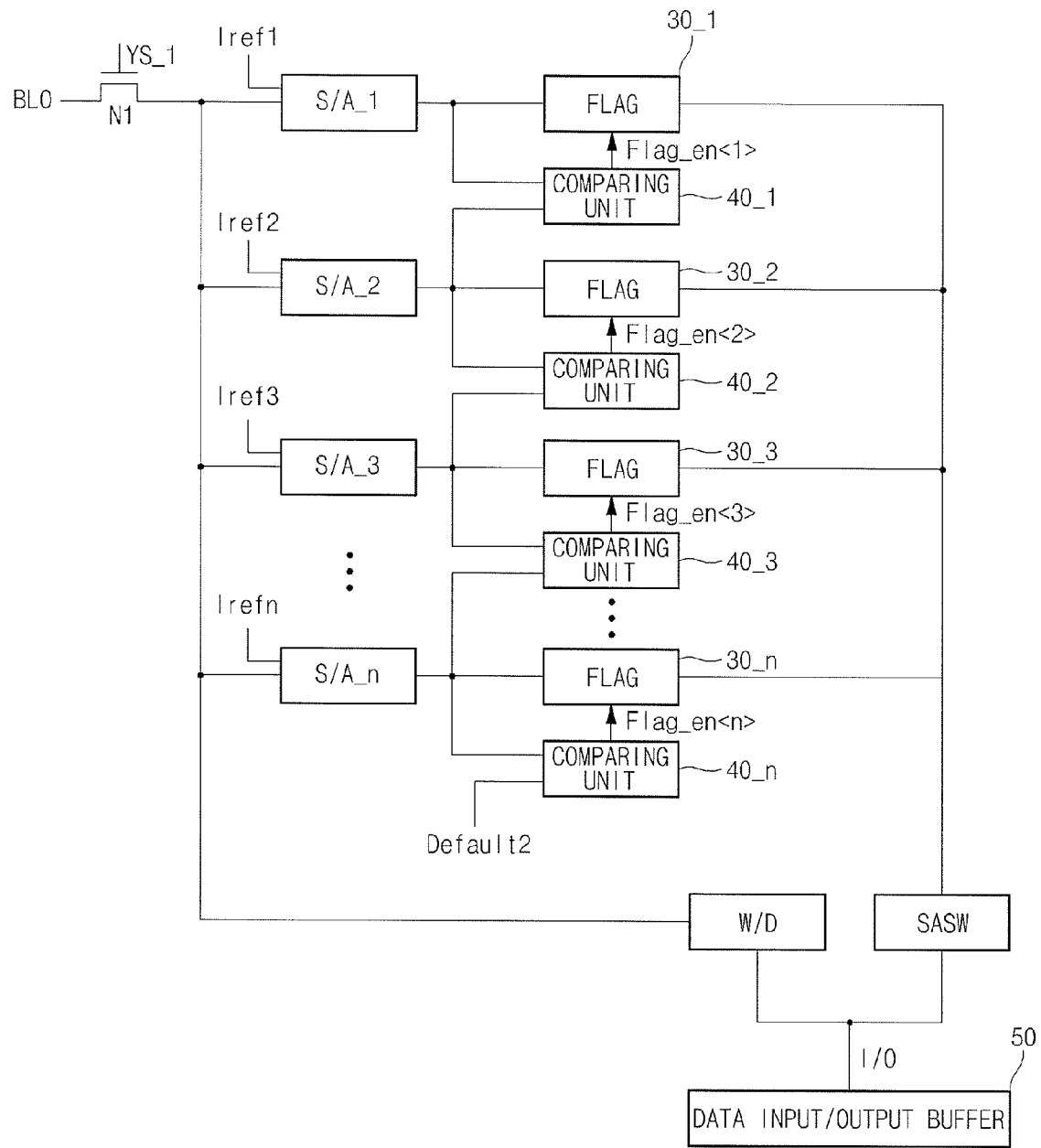
FIG. 7 is a circuit diagram showing a sense amplifier and a write driving unit according to the second embodiment of the present invention.

FIG. 7 is a circuit diagram showing a sense amplifier S/A and a write driving unit W/D according to the second embodiment of the present invention.

A phase change memory device includes a plurality of sense amplifiers S/A_1~S/A_n, a plurality of flags 30_1~30_n, a plurality of comparing units 40_1~40_n, a write driving unit W/D, a sense amplifier switching unit SASW, and a data input/output buffer 50.

Each comparing unit 40_1~40_n compares the output signal of the corresponding sense amplifiers S/A_1~S/A_n with the output signal of the subsequent neighboring sense amplifier S/A_1~S/A_n, respectively, to output a plurality of flag enable signals Flag_en<1:n>. For example, comparing unit 40_2 compares the output signals of corresponding sense amplifier S/A_2 and subsequent neighboring sense amplifier S/A_3 to output flag enable signal Flag_en3. The last comparing unit 40_n may compare an output signal of the corresponding sense amplifier S/A_1 with an initial value Default 2. The initial value Default 2 is the data "1".

Although the column selecting switching element N1 is connected to the sense amplifiers S/A_1~S/A_n in the embodiments of the present invention discussed above, the present invention is not limited herein. Preferably, the reset column selecting switching elements N2~N4 of FIG. 5 are connected to the sense amplifiers S/A_1~S/A_n.

Figure 8:
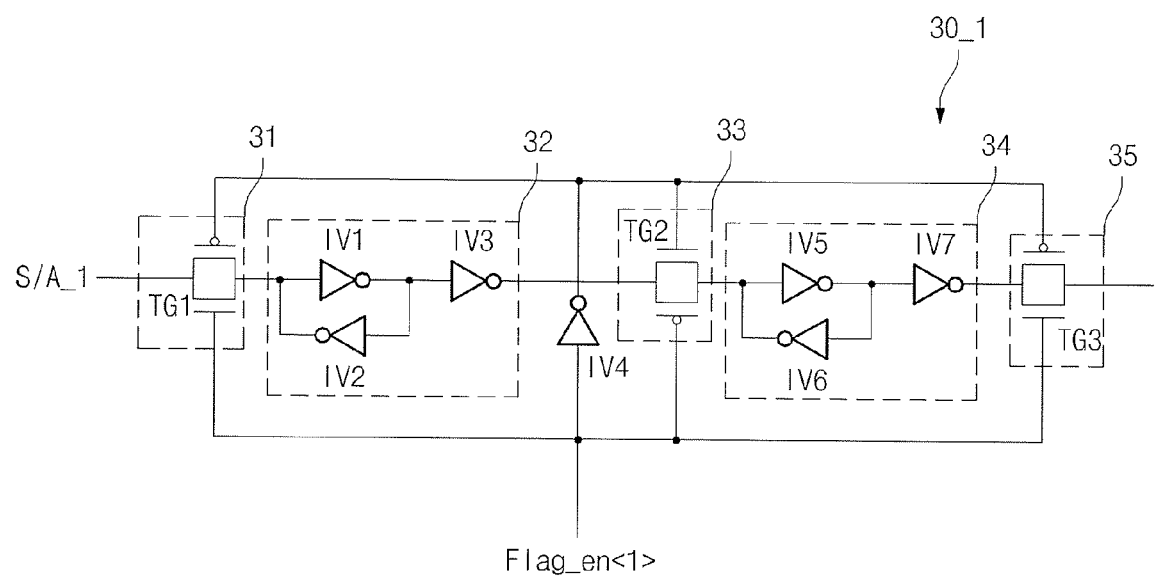
FIG. 8 is a circuit diagram showing a flag of FIGS. 6 and 7.

FIG. 8 is a circuit diagram showing the flag 30_1 as a representative of the flags 30_1~30_n of FIGS. 6 and 7.

The flag 30_1 includes transmission units 31, 33, 35, latch units 32, 34, and an inverter IV4.

The transmission unit 31 includes a transmission gate TG1, which is controlled by the flag enable signal Flag_en<1>. The transmission gate TG1 selectively outputs an output signal of the sense amplifier S/A_1.

The transmission unit 33 includes a transmission gate TG2, which is controlled by the flag enable signal Flag_en<1>. The transmission gate TG2 selectively outputs an output signal of the latch unit 32.

The transmission unit 35 includes a transmission gate TG3, which is controlled by the flag enable signal Flag_en<1>. The transmission gate TG2 selectively outputs an output signal of the latch unit 34.

The transmission gates TG1, TG3 are switched on when the flag enable signal Flag_en<1> is activated to a high level. The transmission TG2 is switched on when the flag enable signal Flag_en<1> is inactivated to a low level.

The latch unit 32 includes an inverter IV3 and a latch comprising inverters IV1, IV2. The inverter IV1 inverts an output signal of the transmission gate TG1. The inverter IV2 inverts an output signal of the inverter IV1. The inverter IV3 inverts the output signal of the latch comprised of the inverters IV1, IV2.

The latch unit 34 includes an inverter IV7 and a latch comprising inverters IV5, IV6. The inverter IV5 inverts an output signal of the transmission gate TG2. The inverter IV6 inverts an output signal of the inverter IV5. The inverter IV7 inverts output signals of the latch comprised of IV5, IV6. The inverter Iv4 inverts the flag enable signal Flag_en<1>.

Figure 9:
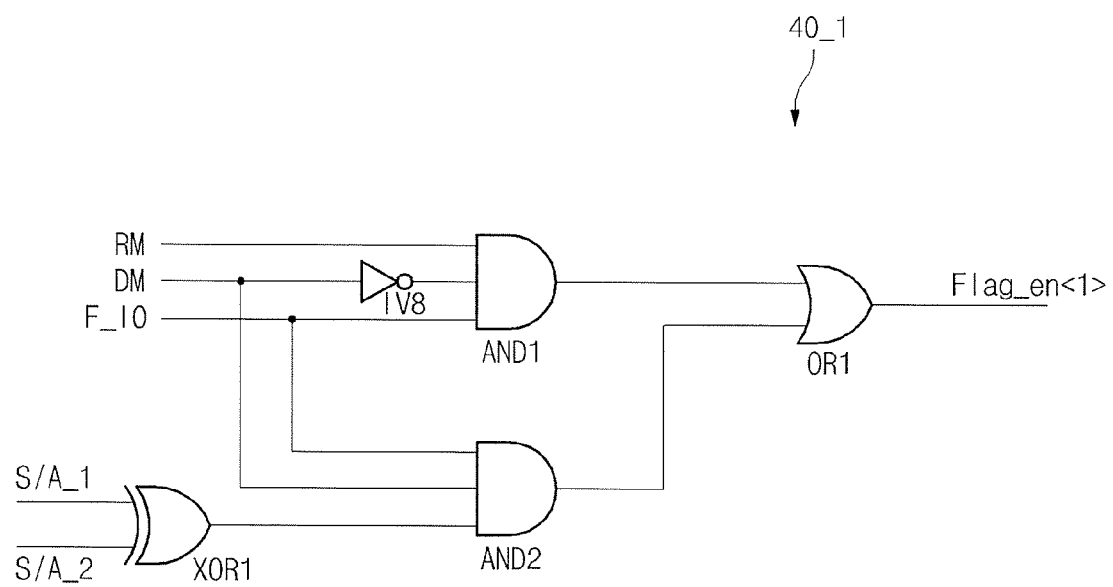
FIG. 9 is a circuit diagram showing a comparing unit of FIGS. 6 and 7.

FIG. 9 is a circuit diagram showing the comparing unit 40_1 as a representative of the comparing units 40_1~40_n of FIGS. 6 and 7.

The comparing unit 40_1 includes an exclusive OR gate XOR1, an inverter IV8, AND gates AND1, AND2, and an OR gate OR1.

The exclusive OR gate XOR1 performs an exclusive OR logic operation on output signals of the sense amplifier S/A_1 and the sense amplifier S/A_2. The inverter IV8 inverts a verification mode signal DM.

The AND gate AND1 performs a logic AND operation on a read mode signal RM, an output signal of the inverter IV8, and a flag input/output control signal F_IO. The AND gate AND2 performs a logic AND operation on an output signal of the OR gate XOR1, the verification mode signal DM, and the flag input/output control signal F_IO.

The OR gate OR1 receives the output signals of the AND gates AND1, AND2, and performs a logic OR operation thereon to output the flag enable signal Flag_en<1>.

Figure 10:
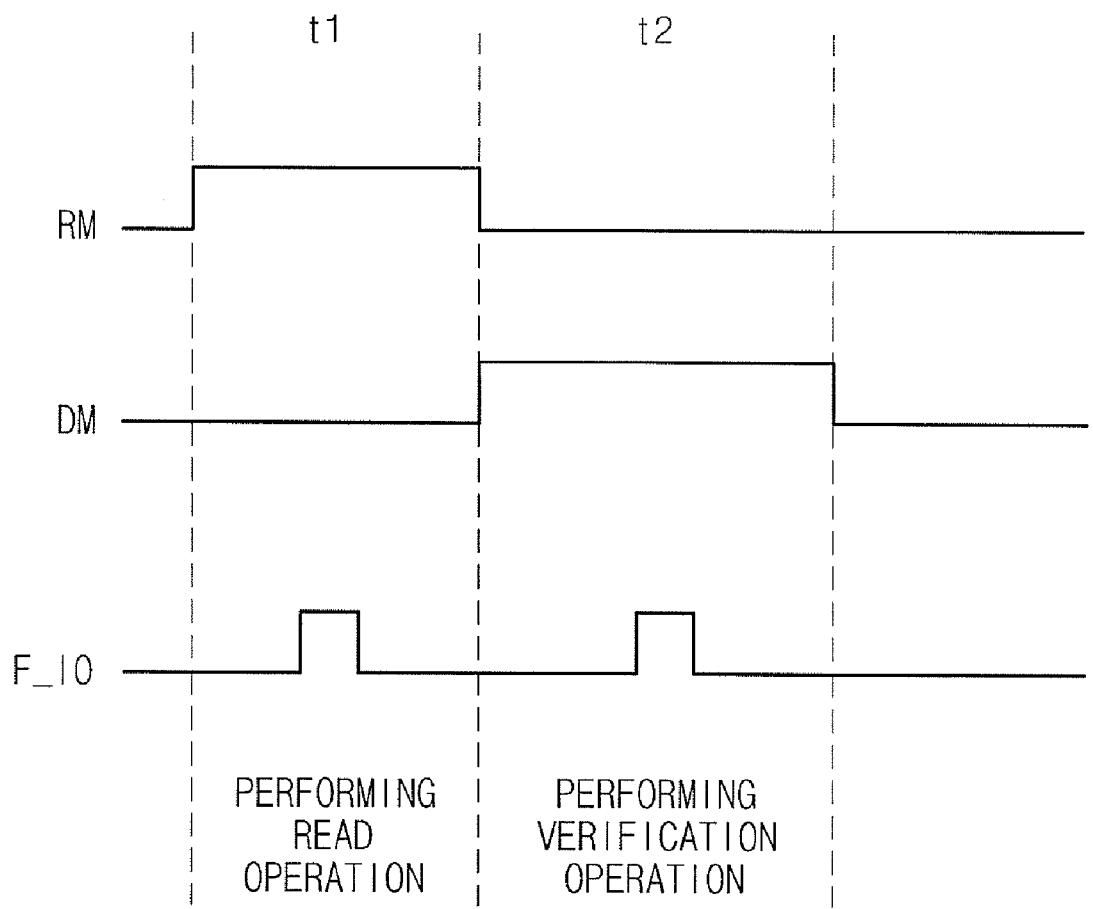
FIG. 10 is a timing diagram showing the relationship of a read mode signal, a verification mode signal, and a flag input/output control signal of FIG. 9.

FIG. 10 is a timing diagram showing relationships of the read mode signal RM, the verification mode signal DM, and the flag input/output control signal F_IO of FIG. 9.

In a period t1, the read mode signal RM is activated and the verification mode signal DM is inactivated. That is, during the period t1 the read mode signal RM is maintained at a high level and the verification mode signal is maintained at a low level. The flag input/output control signal F_IO is transitioned to a high level for a given period during the period t1 to perform a read operation.

When the flag input/output control signal F_IO is transitioned to the high level, the flag enable signal Flag_en<1> is at the high level thereby switching on the transmission gate TG1. A data read through the sense amplifier S/A_1 is transmitted to the latch unit 32 shown in FIG. 8.

When the flag input/output control signal F_IO is transitioned to a low level the flag enable signal Flag_en<1> is also transitioned to a low level. As a result the transmission gate TG2 is switched on and a data latched in the latch unit 32 is transmitted to the latch unit 34.

In a period t2, the read mode signal RM is inactivated and the verification mode signal DM is activated. That is, during the period t2 the read mode signal RM is maintained at a low level and the verification mode signal is maintained at a high level. The flag input/output control signal F_IO is transitioned to a high level for a given period to perform a verification operation.

When a data read through the sense amplifier S/A_1 does not equal to a data read through the sense amplifier S/A_2, an output signal of the exclusive OR gate XOR1 shown in FIG. 9 transitions to a high level.

When the flag input/output control signal F_IO is transitioned to a high level, the flag enable signal Flag_en<1> is also transitioned to the high level. As a result, the transmission gate TG3 is switched on and a data latched in the latch unit 34 is outputted externally.

Figure 11:
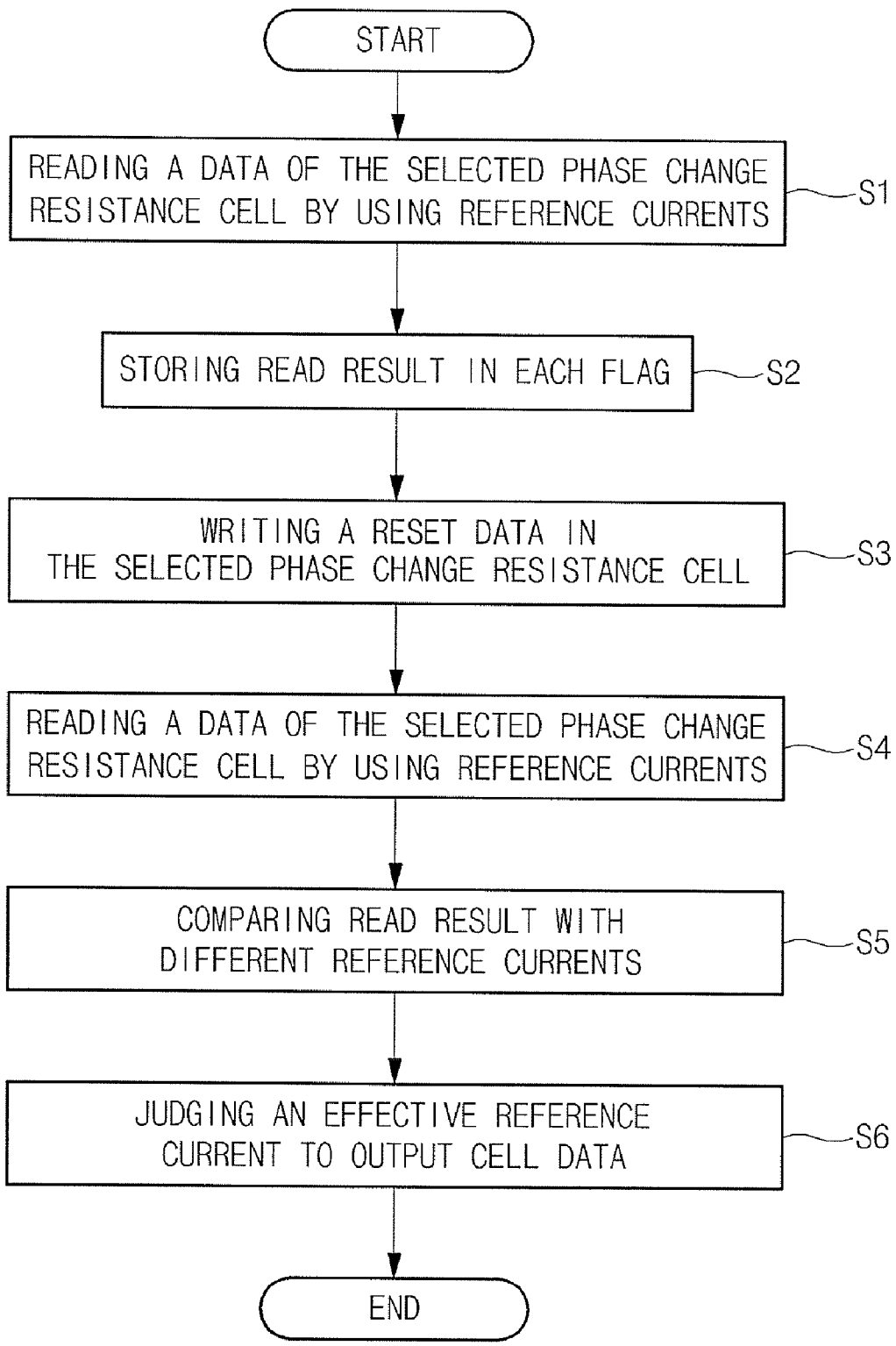
FIG. 11 is a flow chart showing a read cycle operating method according to the first embodiment of the present invention.

FIG. 11 is a flow chart showing a read cycle operating method according to the first embodiment of the present invention.

When a read cycle starts, the column selecting signal YS_1 of the column selecting signals YS_1~YS_4 is activated. When the column selecting signal YS_1 is activated the NMOS transistor N1 is turned on and a data of the phase change resistance cell C is applied to the sense amplifiers S/A_1~S/A_n through the bit line BL0.

Each of the sense amplifiers S/A_1~S/A_n compares a data of the selected phase change resistance cell C with the reference currents Iref1~Irefn and outputs a reset data or a set data accordingly (step S1).

The output signals of the sense amplifiers S/A_1~S/A_n are stored in the flags 30_1~30_n respectively (step S2).

The reset data is provided to the input/output line I/O through the data input/output buffer 50. The write driving unit W/D applies a write voltage corresponding to the reset data to the phase change resistance cell C. As a result, the reset data is written in the selected phase change resistance cell C (step S3).

The sense amplifiers re-read a data of the selected phase change resistance cell C in order to extract the effective reference current of the reference currents Iref1~Irefn. Each of the sense amplifiers S/A_1~S/A_n compares a data of the phase change resistance cell C with the reference currents Iref1~Irefn and outputs the reset data or the set data (step S4).

The comparing units 40_1~40_n compare the read results with one of the reference currents Iref1~Irefn (step S5). For example, when the output signal of the sense amplifier S/A_1 is the set data, the output signal of the sense amplifier S/A_2 is the reset data, and the output signal of each subsequent sense amplifier S/A_n is the reset data, and as such the comparing unit 40_2 outputs the activated flag enable signal Flag_en<2>.

In the distribution of the reset current Ireset of the phase change resistance cell C, the output signal is determined to be the set data based on the reference currents Iref1, Iref2, and the output signal is determined to be the reset data based on the reference current Iref3. As a result, the output signal of the OR gate XORL of the comparing unit 40_2 transitions to a high level, thereby activating the flag enable signal Flag_en<2> to a high level.

The flag 30_2 that receives the activated flag enable signal Flag_en<2>, and cell data stored in the flag 30_2 is outputted through the data input/output buffer 50 (step S6). A read condition for outputting the data of the phase change resistance cell C as an effective data is the reference current Iref2. As a result, the effective reference current may be extracted in the phase change resistance cell C to make a cell group according to each reference current.

Figure 12:
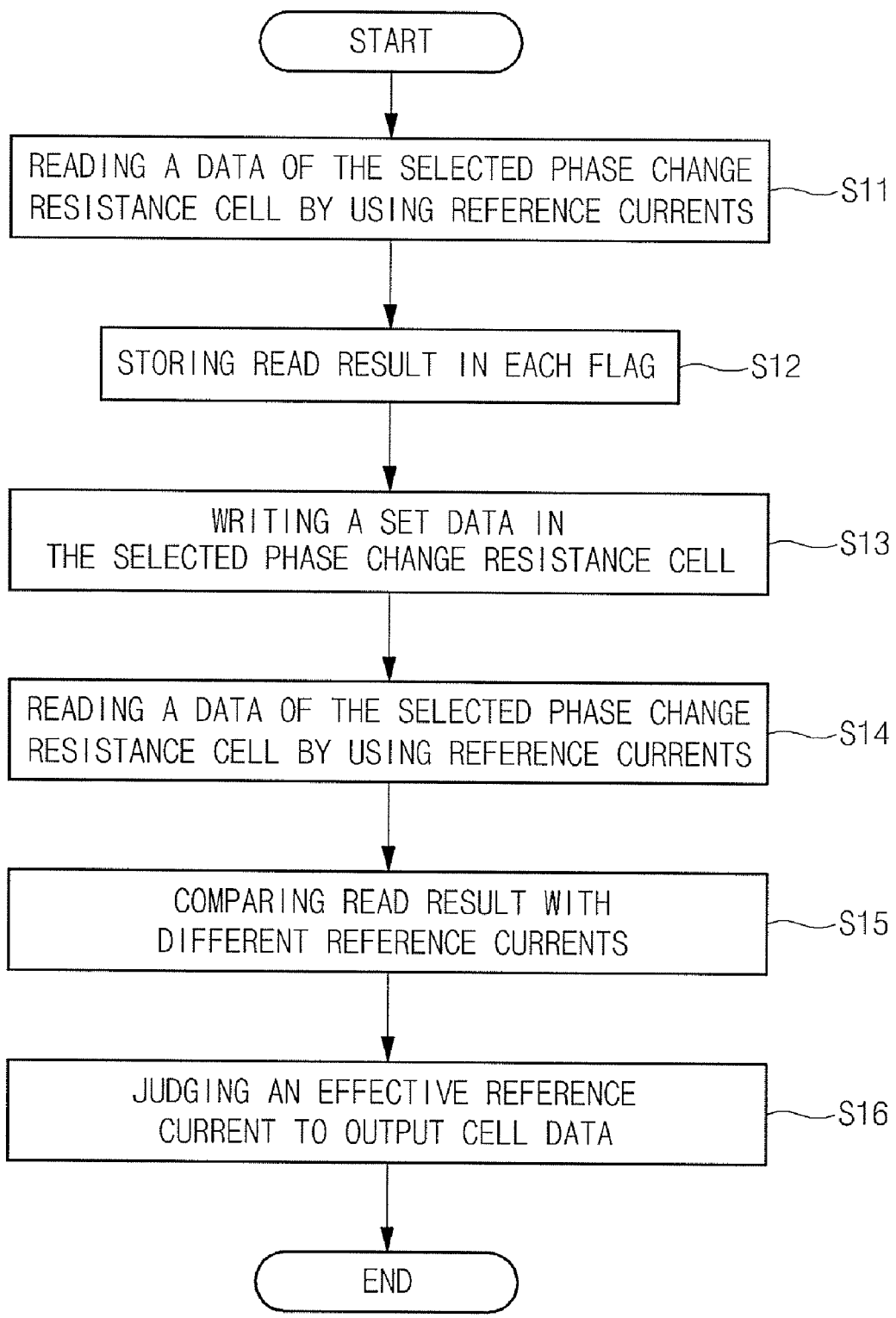
FIG. 12 is a flow chart showing a read cycle operating method according to the second embodiment of the present invention.

FIG. 12 is a flow chart showing a read cycle operating method according to the second embodiment of the present invention.

When a read cycle starts, the column selecting signal YS_1 of the column selecting signals YS_1~YS_4 is activated. When the column selecting signal YS_1 is activated the NMOS transistor N1 is turned on and a data of the phase change resistance cell C is applied to the sense amplifiers S/A_1~S/A_n through the bit line BL0.

Each of the sense amplifiers S/A_1~S/A_n compares a data of the phase change resistance cell C with the reference currents Iref1~Irefn and outputs a reset data or a set data accordingly (step S11).

The output signals of the sense amplifiers S/A_1~S/A_n are stored in the flags 30_1~30_n respectively (step S12). The set data is provided to the input/output line I/O through the data input/output buffer 50. The write driving unit W/D applies a write voltage corresponding to the reset data to the phase change resistance cell C. As a result, the set data is written in the selected phase change resistance cell C (step S13).

The sense amplifiers re-read a data of the selected phase change resistance cell C in order to extract the effective reference current of the reference currents Iref1~Irefn. Each of the sense amplifiers S/A_1~S/A_n compares a data of the phase change resistance cell C with the reference currents Iref1~Irefn and output the reset data or the set data (step S14).

The comparing units 40_1~40_n compare the read results with one of the reference currents Iref1~Irefn (step S15). For example, when the output signal of the sense amplifier S/A_1 is the set data, the output signal of the sense amplifier S/A_2 is the set data, the output signal of the sense amplifier S/A_3 is the reset data, and the output signal of the sense amplifier S/A_n is the reset data, the comparing unit 40_2 outputs the activated flag enable signal Flag_en<2>.

In the distribution of the set current Iset of the phase change resistance cell C, the output signal is determined to be the set data based on the reference currents Iref1, Iref2, and the output signal is determined to be the reset data based on the reference current Iref3. As a result, the output signal of the OR gate XOR1 of the comparing unit 40_2 transitions to a high level, thereby activating the flag enable signal Flag_en<2> to a high level.

The flag 30_2 that receives the activated flag enable signal Flag_en<2>, so that a cell data stored in the flag 30_2 is outputted through the data input/output buffer 50 (step S16). A read condition for outputting the data of the phase change resistance cell C as an effective data is the reference current Iref2. As a result, the effective reference current may be extracted in the phase change resistance cell C to make a cell group according to each reference current.

Figure 13:
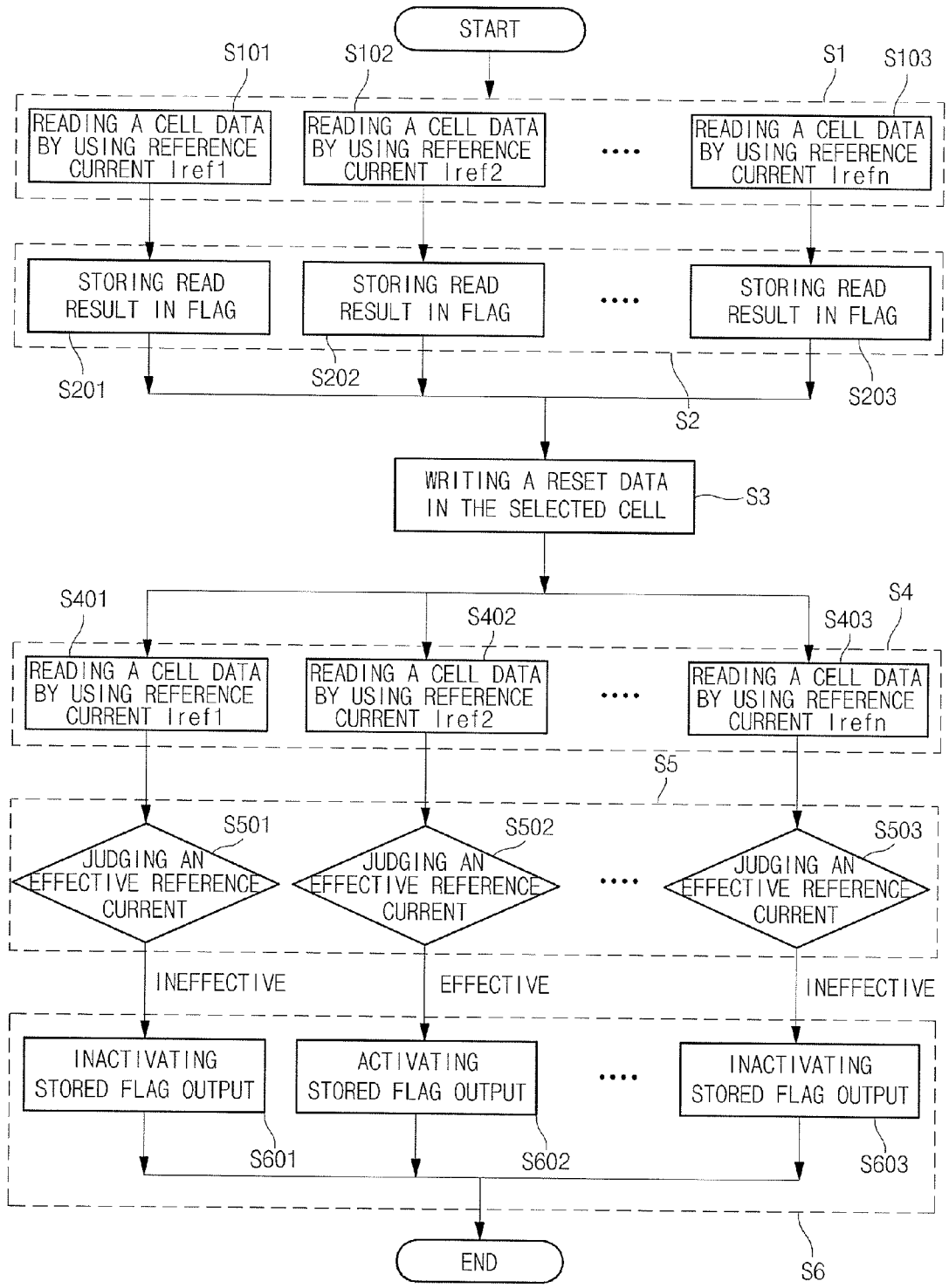
FIG. 13 is a detailed flow chart showing a read cycle operating method according to the first embodiment of the present invention.

FIG. 13 is a detailed flow chart showing a read cycle operating method according to the first embodiment of the present invention.

When a read cycle starts, the sense amplifier S/A_1 reads a data of the phase change resistance cell C selected by the reference current Iref1 (step S101). The sense amplifier S/A_2 reads a data of the phase change resistance cell C selected by the reference current Iref2 (step S102). The sense amplifier S/A_n reads a data of the phase change resistance cell C selected by the reference current Irefn (step S103).

The flag 30_1 stores the output signal of the sense amplifier S/A_1 (step S201), and the flag 30_2 stores the output signal of the sense amplifier S/A_2 (step S202). The flag 30_n stores the output signal of the sense amplifier S/A_n (step S203).

A characteristic of the selected phase change resistance cell C is determined when the reset data is written in the selected phase change resistance cell C through the data input/output buffer 50 (step S301). The write driving unit W/D applies a write voltage corresponding to the reset data to the selected phase change resistance cell C.

The sense amplifier S/A_1 re-reads a data of the phase change resistance cell C selected by the reference current Iref1 (step S401). The sense amplifier S/A_2 re-reads a data of the phase change resistance cell C selected by the reference current Iref2 (step S402). The sense amplifier S/A_n re-reads a data of the phase change resistance cell C selected by the reference current Irefn (step S403).

The effectiveness of the reference current Iref1 is determined (step S501). the effectiveness of the reference current Iref2 is determined (step S502). The effectiveness of the reference current Irefn is determined (step S503).

The comparing unit 40_1 compares the initial value Default 1 with the output signal of the sense amplifier S/A_1. The comparing unit 40_2 compares the output signal of the sense amplifier S/A_1 with that of the sense amplifier S/A_2. The comparing unit 40_n compares the output signal of the sense amplifier S/A_n-1 with that of the sense amplifier S/A_n.

The comparing unit 40_1 determines the reference current Iref1 is ineffective when the initial vale Default 1 is equal to the output signal of the sense amplifier S/A_1. The comparing unit 40_2 determines the reference current Iref2 is effective when the output signal of the sense amplifier S/A_1 is not equal to the output signal the sense amplifier S/A_2. The comparing unit 40_n determines the reference current Irefn is ineffective when the output signal of the sense amplifier S/A_n-1 is not equal to the output signal sense amplifier S/A_n.

The flag 30_1 is inactivated (step S601), and the flag 30_2 is activated (step S602). The flag 30_n is inactivated (step S603).

The output signal of the sense amplifier S/A_2 stored in the flag 30_2 is outputted through the data input/output buffer 50. A read condition for outputting an effective cell data in the selected phase change resistance cell C is the reference current Iref2.

Figure 14:
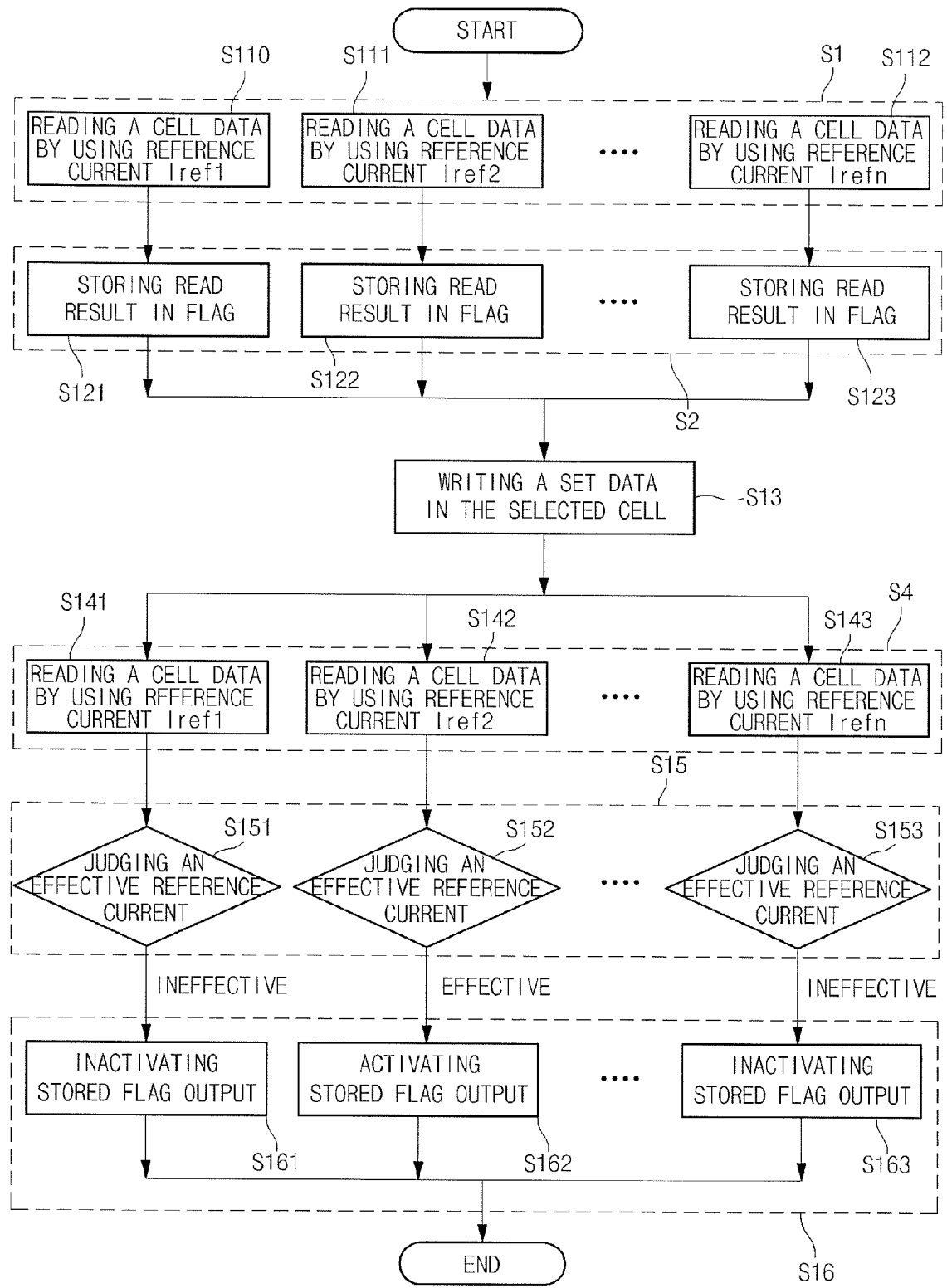
FIG. 14 is a detailed flow chart showing a read cycle operating method according to the second embodiment of the present invention.

FIG. 14 is a detailed flow chart showing a read cycle operating method according to the second embodiment of the present invention.

When a read cycle starts, the sense amplifier S/A_1 reads a data of the phase change resistance cell C selected by the reference current Iref1 (step S110). The sense amplifier S/A_2 reads a data of the phase change resistance cell C selected by the reference current Iref2 (step S111). The sense amplifier S/A_n reads a data of the phase change resistance cell C selected by the reference current Irefn (step S112).

The flag 30_1 stores the output signal of the sense amplifier S/A_1 (step S121), and the flag 30_2 stores the output signal of the sense amplifier S/A_2 (step S122). The flag 30_n stores the output signal of the sense amplifier S/A_n (step S123).

A characteristic of the selected phase change resistance cell C is determined when the set data is written in the selected phase change resistance cell C through the data input/output buffer 50 (step S13). The write driving unit W/D applies a write voltage corresponding to the reset data to the selected phase change resistance cell C.

The sense amplifier S/A_1 re-reads a data of the phase change resistance cell C selected by the reference current Iref1 (step S141). The sense amplifier S/A_2 re-reads a data of the phase change resistance cell C selected by the reference current Iref2 (step S142). The sense amplifier S/A_n re-reads a data of the phase change resistance cell C selected by the reference current Irefn (step S143).

The effectiveness of the reference current Iref1 is determined (step S151). the effectiveness of the reference current Iref2 is determined (step S152). the effectiveness of the reference current Irefn is determined (step S153).

The comparing unit 40_1 compares the output signal of the sense amplifier S/A_1 with that of the sense amplifier S/A_2. The comparing unit 40_2 compares the output signal of the sense amplifier S/A_2 with that of the sense amplifier S/A_3. The comparing unit 40_n compares the output signal of the sense amplifier S/A_n with the initial value Default 2.

The comparing unit 40_1 determines the reference current Iref1 is ineffective when the output signal of the sense amplifier S/A_1 is equal to the output signal of the sense amplifier S/A_2. The comparing unit 40_2 determines the reference current Iref2 is effective when the output signal of the sense amplifier S/A_1 is not equal to the output signal of the sense amplifier S/A_2. The comparing unit 40_n determines the reference current Irefn is ineffective when the output signal of the sense amplifier S/A_n is equal to the initial value Default 2.

The flag 30_1 is inactivated (step S161), and the flag 30_2 is activated (step S162). The flag 30_n is inactivated (step S163).

The output signal of the sense amplifier S/A_2 stored in the flag 30_2 is outputted through the data input/output buffer 50. A read condition for outputting an effective cell data in the selected phase change resistance cell C is the reference current Iref2.

Figure 15:
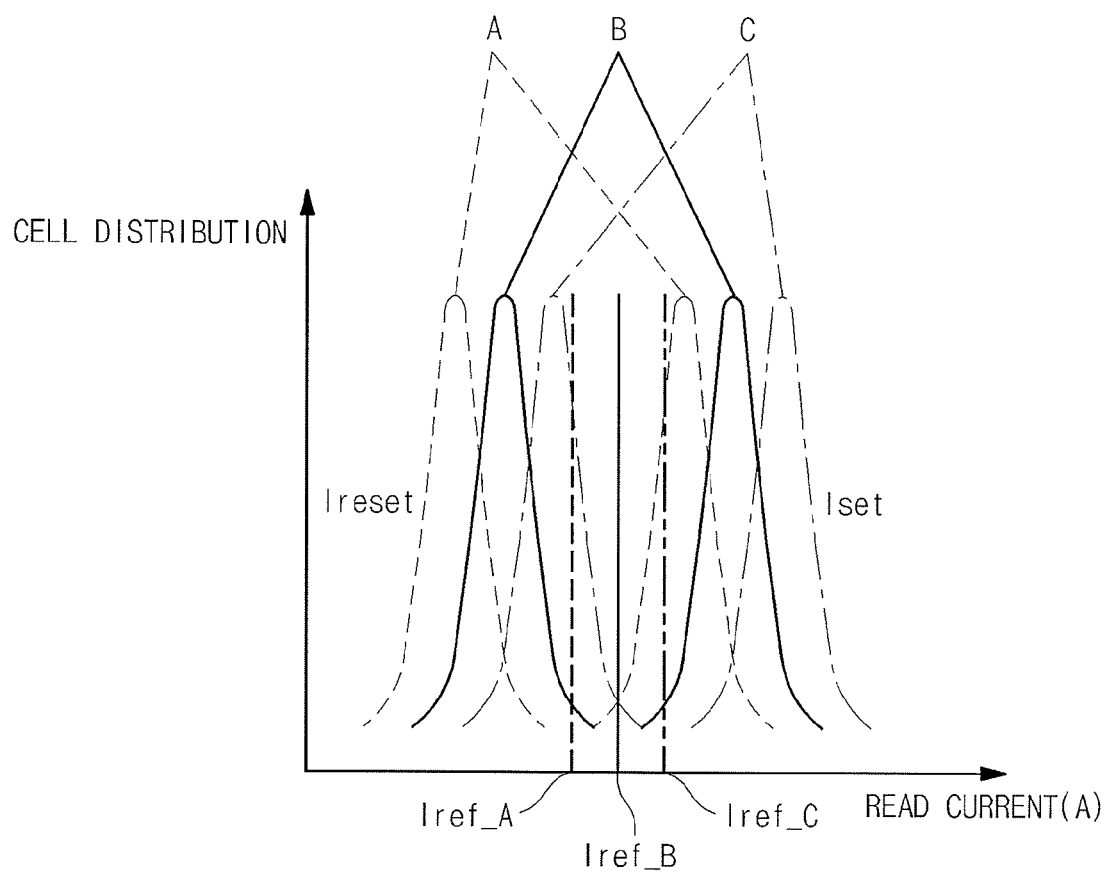
FIG. 15 is a diagram showing a read current relationship of a phase change memory device according to an embodiment of the present invention.

FIG. 15 is a diagram showing a read current relationship of a phase change memory device according to an embodiment of the present invention.

Each cell included in a plurality of cell arrays has a different read current distribution depending on process, element, and design conditions. That is, the distribution of a set current Iset and a reset current Ireset becomes broader based on a reference current Iref.

If a characteristic group of each cell is divided into three regions A, B, C, the distribution of the set current Iset and the reset current Ireset is located at a different region. As a result, effective reference currents corresponding to characteristics of each region A, B, C in the reference currents Iref_A, Iref_B. Iref_C are extracted. If there are n cell characteristic groups, n reference currents are applied to extract effective reference currents.

Although an initial cell read characteristic is different, a reference current condition is changed so that a data can be read.

As a result, the read current distribution of all cells may be refined so as to eliminate the fail condition associated with the conventional device.

As described above, a phase change memory device according to an embodiment of the present invention outputs an effective data with a reference current corresponding to a characteristic of each phase change resistance cell included in a cell array in a read mode.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cell array unit including a phase change resistance cell positioned at an intersection of a word line and a bit line;
   a plurality of sense amplifiers sensing and amplifying a data of the phase change resistance cell according to a plurality of reference currents; and
   a plurality of comparing units, each comparing unit of the plurality of comparing units
   comparing an output signal of a corresponding sense amplifier among the plurality of sense amplifiers to an output signal of a neighboring sense amplifier, and
   outputting a flag enable signal.

2. The phase change memory device according to claim 1, wherein each comparing unit of the plurality of comparing units outputs an activated flag enable signal when the output signal of the corresponding sense amplifier is different from that of the neighboring sense amplifier.

3. The phase change memory device according to claim 1, further comprising a plurality of flags storing the output signals of the plurality of sense amplifiers and outputting the stored output signals in response to the flag enable signal.

4. The phase change memory device according to claim 3, wherein each flag of the plurality flags comprises:
   a first transmission unit transmitting the output signal of the corresponding sense amplifier in response to the flag enable signal;
   a first latch unit storing an output signal of the first transmission unit;

a second transmission unit transmitting an output signal of the first latch unit in response to the flag enable signal;

a second latch unit storing an output signal of the second transmission unit; and a third transmission unit transmitting an output signal of the second latch unit in response to the flag enable signal.

5. The phase change memory device according to claim 1, wherein each comparing unit of the plurality of comparing units comprises:

a first logic element performing a logic operation on the output signal of the corresponding sense amplifier and the output of the neighboring sense amplifier;

a second logic element performing a logic operation on a read mode signal, a verification mode signal, and a flag input/output control signal;

a third logic element performing a logic operation on the verification mode signal, the flag input/output control signal, and an output signal of the first logic element; and a fourth logic element performing a logic operation on an output signal of the second logic element and an output of the and third logic element.

6. The phase change memory device according to claim 5, wherein the first logic element is an exclusive OR gate.

7. The phase change memory device according to claim 5, wherein the second logic element is an AND gate.

8. The phase change memory device according to claim 5, wherein the third logic element is an AND gate.

9. The phase change memory device according to claim 5, wherein the fourth logic element is an OR gate.

10. The phase change memory device according to claim 1, wherein when the neighboring sense amplifier precedes the corresponding sense amplifier a comparing unit at a first position among the plurality of comparing units compares the output signal of the corresponding sense amplifier with an initial value.

11. The phase change memory device according to claim 10, wherein the initial value is data "0".

12. The phase change memory device according to claim 1, wherein when the neighboring sense amplifier succeeds the corresponding sense amplifier a comparing unit at a last position among the plurality of comparing units compares the output signal of the corresponding sense amplifier with an initial value.

13. The phase change memory device according to claim 12, wherein the initial value is data "1".

14. The phase change memory device according to claim 1, wherein the phase change resistance cell comprises:

a phase change resistor sensing a crystallization state changed by current so as to store a corresponding data; and a diode element connected to the phase change resistor and connected to the word line.

15. The phase change memory device according to claim 1, further comprising a column selecting unit connected to the bit line and connected to the plurality of sense amplifiers, wherein the column selecting unit is controlled by a plurality of column selecting signals.

16. The phase change memory device according to claim 15, wherein the column selecting unit comprises a plurality of column selecting switching elements controlled by the plurality of column selecting signals.

17. The phase change memory device according to claim 16, wherein each of the column selecting switching elements is connected to the plurality of sense amplifiers.

18. The phase change memory device according to claim 1, wherein each reference current of the plurality of reference currents has a different current level.

19. An operating method of a phase change memory device comprising a plurality of sense amplifiers each comparing a data of a phase change resistance cell with a plurality of reference currents; a plurality of flags storing output signals of the sense amplifiers; and a plurality of comparing units comparing an output signal of a corresponding sense amplifier with that of a neighboring sense amplifier to control the plurality of flags, the operating method comprising:

reading data of the phase change resistance cell by using the plurality reference currents in a read mode;

storing read data of the phase change resistance cell in the plurality of flags respectively;

writing a first data in the phase change resistance cell;

re-reading data of the phase change resistance cell by using the plurality of reference currents;

comparing the re-read data with different reference currents among the plurality of reference currents; and outputting a data stored in a corresponding flag when the re-read data are not equal.

20. The operating method according to claim 19, wherein the first data is a reset data.

21. The operating method according to claim 19, wherein the first data is a set data.

* * * * *